(12) United States Patent
Tsuruoka et al.

(10) Patent No.: US 6,288,486 B1
(45) Date of Patent: Sep. 11, 2001

(54) MULTI-COLOR ORGANIC ELECTROLUMINESCENCE DEVICE WITH OVERLAPPING LUMINOUS LAYERS

(75) Inventors: Yoshihisa Tsuruoka; Hisamitsu Takahashi; Satoshi Tanaka; Toshio Miyauchi; Tatsuo Fukuda, all of Mobara (JP)

(73) Assignee: Utaba Denshi Kogyo Kabushiki Kaisha, Obara (JP)

( * ) Notice: Subject to any disclaimer, the term of this patent is extended or adjusted under 35 U.S.C. 154(b) by 0 days.

(21) Appl. No.: 09/133,558

(22) Filed: Aug. 13, 1998

(30) Foreign Application Priority Data

Aug. 27, 1997 (JP) .................................................... 9-231154

(51) Int. Cl.[7] .................................................... H05B 33/14
(52) U.S. Cl. ............................................ 313/504; 313/506
(58) Field of Search .................................... 313/504, 503, 313/501, 500, 505, 509, 506

(56) References Cited

U.S. PATENT DOCUMENTS

| 5,693,428 | * | 12/1997 | Fujii et al. | 313/504 |
| 5,703,436 | * | 12/1997 | Forrest et al. | 313/506 |

* cited by examiner

*Primary Examiner*—Michael H. Day
(74) *Attorney, Agent, or Firm*—Oblon, Spivak, McClelland, Maier & Neustadt, P.C.

(57) ABSTRACT

A multi-color organic EL device capable of preventing color mixing due to leakage luminescence while incorporating therein luminous layers formed by mask deposition techniques. Anodes, a hole transport layer, luminous layers different in type from each other and cathodes are laminated. In such a laminate structure, the luminous layers different in type which are arranged adjacently to each other are constructed so as to permit the luminous layer increased in band gap to get between the luminous layer decreased in band gap and the hole transport layer.

4 Claims, 2 Drawing Sheets

MULTI-COLOR ORGANIC ELECTROLUMINESCENCE DEVICE WITH OVERLAPPING LUMINOUS LAYERS

BACKGROUND OF THE INVENTION

1. Field of the Invention

This invention relates to a multi-color organic electroluminescence device, and more particularly to a multi-color organic electroluminescence device exhibiting multi-color display and a method for manufacturing the same.

2. Discussion of the Background

An organic electroluminescence (hereinafter also referred to as "EL") device is constructed so that a thin film containing a fluorescent organic compound is interposedly arranged between cathodes and anodes. The thin film is injected with electrons and holes, which are recombined with each other to generate excitons, which are then subject to deactivation, leading to light emission (fluorescence or luminescence). The organic EL device carries out display using such fluorescence or luminescence.

In order to execute multi-coloring of such an EL device basically constructed as described above, such a structure as shown in FIG. 3 is proposed by way of example. More particularly, an EL device shown in FIG. 3 includes a light-permeable substrate 100 made of glass, which is formed on an inner surface thereof with light-permeable anodes 101 in a predetermined pattern. The anodes 101 each are made of indium tin oxide (ITO). The anodes 101 have luminous layers R, G and B for emitting light of red, green and blue luminous colors arranged thereon in order, respectively, each of which is formed thereon with a cathode 102, which is made of metal such as Mg:Ag, Al:Li or the like. Such an electrode structure is arranged on the substrate 100 while being sealedly isolated from an ambient atmosphere.

In the organic EL device thus constructed, the luminous layers R, G and B are injected with electrons through the cathodes 102, as well as holes through the anodes 101. Then, the electrons and holes are recombined with each other as described above, resulting in excitons being generated. Deactivation of the excitons causes the luminous layers R, G and B to emit light, so that luminous display of predetermined colors defined by band gaps different for every luminous layers R, G and B may be provided. The luminous display thus provided is externally observed through the substrate 100.

In manufacturing of the organic EL device, an organic film of which the luminous layer is made is readily decomposed by water, resulting in formation of a display pattern by photolithography which includes a water development step being failed. Thus, in order to form the display pattern, it is compelled to utilize mask deposition techniques using a mask formed with openings in correspondence to the pattern. The mask deposition techniques are carried out using an apparatus which is so constructed that a mask and a substrate are arranged in a vacuum envelope, wherein a material is deposited on the substrate in a predetermined opening pattern through the mask.

Unfortunately, the vacuum envelope is provided therein with no means for accurately positioning the mask and substrate, so that the mask deposition techniques substantially fail to form the display pattern of the luminous layers at fine pitches.

It would be considered that arrangement of any positioning means for automatically positioning the mask and substrate in the vacuum envelope solves the above-noted problem. Nevertheless, the mask deposition techniques cause another problem. More particularly, deposition through the openings of the mask causes the material for each of the luminous layers passing through the openings to expand in a size larger than the openings, to thereby extend or get under an edge of the luminous layers adjacent thereto, resulting in the luminous layers different in kind or type from each other overlapping with each other at an edge thereof, leading to occurrence of color mixing during luminous operation of the organic ED device.

The above-described problem encountered with the mask deposition techniques that the luminous layer extends or gets under the adjacent luminous layers is not prevented unless the mask and substrate are kept intimately contacted with each other. However, intimate contact between the mask and the substrate possibly causes damage to the thin film formed on the substrate such as, for example, a hole transport layer formed on the anodes (not shown in FIG. 3) or so-called cross-contamination wherein a deposited material adhered to the mask is re-adhered to the thin film, leading to contamination of the thin film. Thus, the problem that the luminous layer gets under the adjacent luminous layers is unavoidable in the mask deposition techniques.

SUMMARY OF THE INVENTION

The present invention has been made in view of the foregoing disadvantage of the prior art.

Accordingly, it is an object of the present invention to provide a multi-color organic EL device which is capable of preventing color mixing due to leakage luminescence while incorporating therein luminous layers formed by mask deposition techniques.

It is another object of the present invention to provide a method for manufacturing a multi-color organic EL device which is capable of preventing color mixing due to leakage luminescence while incorporating therein luminous layers formed by mask deposition techniques.

In accordance with one aspect of the present invention, a multi-color organic EL device is provided. The multi-color organic EL device includes a substrate, anodes formed on the substrate, a hole transport layer formed on the anodes, a plurality of luminous layers different in kind and band gap from each other formed on the hole transport layer and arranged in a manner to be adjacent to each other, and cathodes formed on the luminous layers. The luminous layers different in kind or type which are adjacent to each other are arranged in such a manner that the luminous layer increased in band gap gets between the luminous layer decreased in band gap and the hole transport layer.

In accordance with this aspect of the present invention, multi-color organic EL device is provided. The multi-color organic EL device includes a substrate, a plurality of strip-like anodes formed on the substrate in a manner to be spaced from each other at predetermined intervals, a hole transport layer formed on the substrate so as to cover the anodes, a plurality of luminous layers different in kind and band gap from each other which are formed in a predetermined order on the hole transport layer and arranged in a strip-like manner corresponding to the anodes, and a plurality of strip-like cathodes formed at predetermined intervals on the luminous layers so as to intersect the anodes. The luminous layers different in kind which are adjacent to each other are arranged in such a manner that the luminous layer increased in band gap gets between the luminous layer decreased in band gap and the hole transport layer.

In a preferred embodiment of the present invention, the luminous layers different in kind and band gap from each other include at least two selected from the group consisting of a luminous layer of a blue luminous color, that of a green luminous color and that of a red luminous color.

In accordance with another aspect of the present invention, a method for manufacturing a multi-color organic EL device which includes a substrate, anodes formed on the substrate, a hole transport layer formed on the anodes, a plurality of luminous layers different in kind and band gap from each other formed on the hole transport layer and arranged in a manner to be adjacent to each other, and cathodes formed on the luminous layers is provided. The method includes the step of mask-depositing the luminous layers on the hole transport layer in order from the luminous layer of a large band gap to that of a small band gap.

In accordance with this aspect of the present invention, a method for manufacturing a multi-color organic EL device comprising a substrate, a plurality of strip-like anodes formed on the substrate in a manner to be spaced from each other at predetermined intervals, a hole transport layer formed on the substrate so as to cover the anodes, a plurality of luminous layers different in kind and band gap from each other which are formed in a predetermined order on the hole transport layer and arranged in a strip-like manner corresponding to the anodes, and a plurality of strip-like cathodes formed at predetermined intervals on the luminous layers so as to intersect the anodes is provided. The method includes the step of mask-depositing the luminous layers on the hole transport layer in order from the luminous layer of a large band gap to that of a small band gap.

In a preferred embodiment of the present invention, the luminous layers different in kind and band gap from each other include at least two selected from the group consisting of a luminous layer of a blue luminous color, that of a green luminous color and that of a red luminous color.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENT

Now, a multi-color organic EL device according to the present invention will be described hereinafter with reference to FIGS. 1 and 2.

Figure 1:
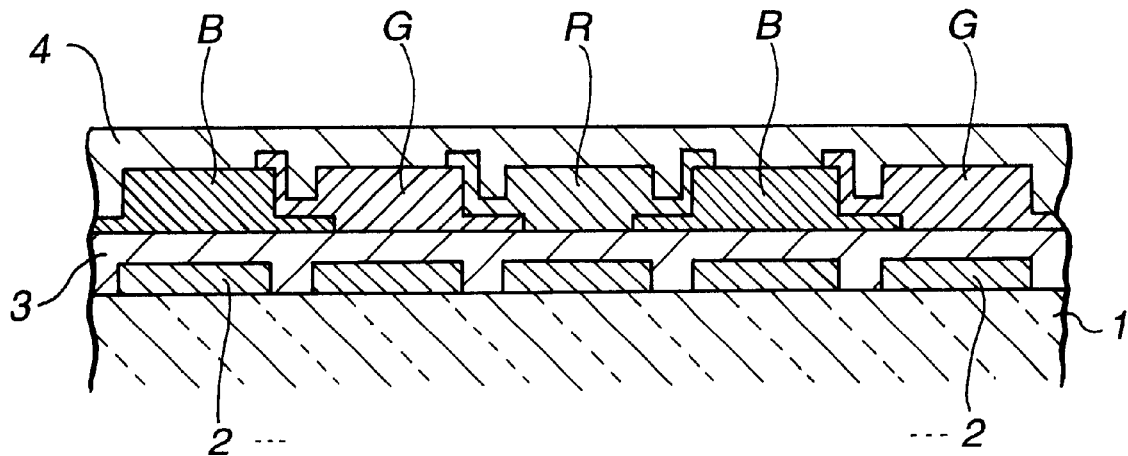
FIG. 1 is a fragmentary sectional view showing an essential part of an embodiment of a multi-color organic EL device according to the present invention.

Referring first to FIG. 1, an embodiment of a multi-color organic EL device according to the present invention is illustrated. A multi-color organic EL device of the illustrated embodiment includes a light-permeable substrate 1 made of glass. The substrate 1 is formed on an inner surface thereof with a plurality of light-permeable anodes 2 in a strip-like pattern. The anodes 2 are made of indium tin oxide (ITO) and arranged in a manner to be parallel to each other at predetermined intervals. Also, the substrate 1 is formed thereon with a hole transport layer 3 so as to cover the anodes 2. The hole transport layer 3 has a substantially smoothly finished surface, on which luminous layers B, G and R respectively emitting light of blue, green and red luminous colors are repeatedly deposited in order. The luminous layers are arranged in a strip-like pattern and in a manner to positionally correspond to the anodes 2 while being in parallel with the anodes 2. Further, the EL device of the illustrated embodiment includes a plurality of cathodes 4 made of metal such as Mg:Ag, Al:Li or the like and arranged on the luminous layers B, G and R so as to extend in a direction perpendicular to the anodes 2 in a strip-like pattern. A whole laminate structure of the above-described organic film and electrodes is sealedly arranged on the substrate 1.

In the organic EL device of the illustrated embodiment, a doped type luminous layer may be used as the luminous layer. Such a doped type luminous layer is made by doping or mixing a luminous layer material or host material with an organic phosphor material in a trace amount of, for example, 0.1 to 10 mol %. Use of such a doped type luminous layer in the organic EL device permits the device to be improved in luminous performance. In the doped type luminous layer, a recombination state or excitation state in the luminous layer material or host material causes energy transfer to the doping material, leading to luminescence of the doping material. This permits some advantages to be exhibited.

More particularly, even when the luminous layer material is fixed, a variation in doping material permits a luminous color peculiar to the doping material varied to be obtained. In this respect, energy transfer renders conversion from the luminous layer material to a short wavelength side impossible.

Separation of performance of the luminous layers leads to an improvement in luminous efficiency and stability. When the organic EL device is free from any doping, the luminous layer is required to carry out injection of charges, transfer thereof and luminescence with increased stability. In this respect, selection of a doping material increased in energy transfer efficiency permits an increase in efficiency and stability of injection of charges, transfer thereof and luminescence.

In the illustrated embodiment, of the luminous layers R, G and B, the luminous layer B is constructed into such a doped type luminous layer.

Relatively comparing band gaps of the luminous layers B, G and R respectively emitting light of blue, green and red luminous colors with each other, the luminous layer R layer B has the largest band gap and the luminous has the smallest band gap. Thus, the luminous layer R has a band gap of a magnitude between those of the luminous layers B and G. In the illustrated embodiment, the luminous layers different in type or kind from each other which are adjacent to each other are arranged so as to overlap at an edge thereof with each other and formed in such a manner that the luminous layer having a larger band gap extends or gets between the luminous layer having a smaller band gap and the hole transport layer 3. More particularly, the luminous layer B emitting light of a blue luminous color gets at an edge thereof under the luminous layer G emitting light of a green luminous color. Also, the luminous layer G emitting light of a green luminous color gets at an edge thereof under the luminous layer R emitting light of a red luminous color.

In the organic EL device of the illustrated embodiment thus constructed, the luminous layers R, G and B each are injected with electrons from the cathodes 4 and holes from the anodes 2. Then, the electrons and holes thus injected are recombined with each other to generate excitons. Deactivation of the excitons causes emission of light from the luminous layers, so that display of colors defined by the band gaps of the luminous layers different in kind or type from each other may be provided.

In the organic EL device of the illustrated embodiment, the adjacent luminous layer which gets between the edge of each of the luminous layers and the hole transport layer 3 is increased in band gap Eg as compared with that of the luminous layer to emit light. This permits recombination energy to be moved to a side of the luminous layer of a small band gap Eg to emit light, to thereby keep the adjacent luminous layer which gets under the hole transport layer 3 from emitting light.

It is considered that a luminous region of a doped type organic EL device is defined on a side of a luminous layer at an interface of an organic layer. Thus, the luminous layer getting under the cathode 4 in the illustrated embodiment is kept from emitting light.

Thus, the organic EL device of the illustrated embodiment ensures satisfactory display quality even when the strip-like anodes 2 each made of ITO are arranged at intervals of 0.15 mm and further at intervals as small as 0.05 mm.

Manufacturing of the organic EL device of the illustrated embodiment including the luminous layers constructed as described above is carried out using a mask including strip-like openings of a predetermined width. The mask may be either separately or commonly used for manufacturing the luminous layers of the various luminous colors. The substrate formed thereon with the anodes 2 and hole transport layer 3 and the mask are positioned at a predetermined interval in a vacuum envelope and then the luminous layers are mask-deposited on the hole transport layer 3 in the order of from the luminous layer increased in magnitude of the band gap to that reduced in magnitude thereof. In the illustrated embodiment, the deposition is carried out in the order of the luminous layer B of a blue luminous color, that G of a green luminous color and that R of a red luminous color. A gap of a predetermined size is defined between the mask and the hole transport layer 3, so that a material to be deposited may travel toward the substrate 1 while being spread in an area larger than a size of the openings of the mask. More specifically, the deposited material gets behind the openings of the mask, to thereby reach an edge of the adjacent luminous layers. Thus, employment of the mask deposition techniques necessarily causes the material to get under the hole transport layer 3. However, in the illustrated embodiment, the deposition is carried out in the order of a magnitude of the band gap Eg, therefore, it is the luminous layer increased in band gap Eg that gets under the hole transport layer 3 at the edge of each of the luminous layers. This effectively prevents leakage luminescence as described above. Then, the cathodes 4 are deposited on the luminous layers B, G and R, resulting in a laminate structure being provided. The electrodes and the like constituting the laminate structure are encapsulated in an envelope constituted of the anode substrate, a cathode substrate, resin and the like. Wirings extending from the anodes 2 and cathodes 4 are led out while airtightly passing through a sealed portion of the envelope.

Materials for the luminous layers includes those indicated by the following chemical formulas (1) to (4):

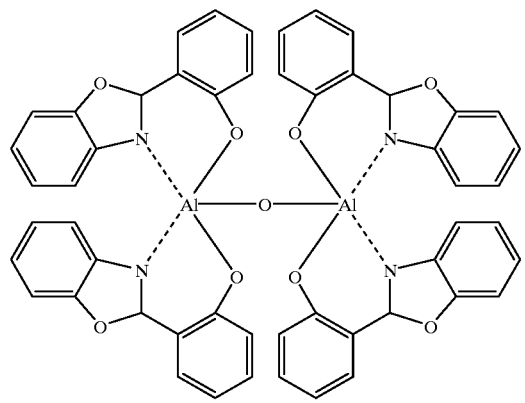

The chemical formula (1) indicates $Al_2O(OXZ)_4$, $\mu$-oxo-di [2-(benzoxazoyl)-phenolate)] aluminum (III). It emits light of a blue luminous color and has a band gap Eg of 3.13 eV.

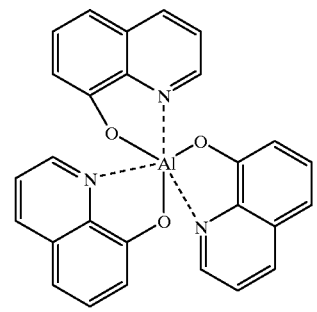

The chemical formula (2) indicates $Alq_3$, tris(8-quinolinolate)aluminum (III). It emits light of a green luminous color and has a band gap Eg of 2.9 eV.

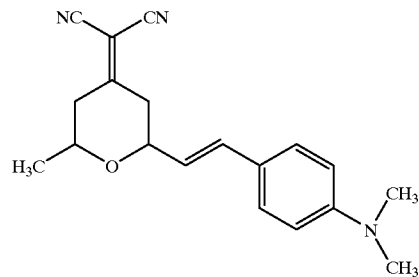

The chemical formula (3) indicates $Alq_3$+DCM dope (1 mol %), 4-(dicyanomethylene)-6-(p-dimethylaminostyryl)-2-methyl-4H-pyran. It exhibits a red luminous color and has a band gap Eg of 2.08 eV. In the illustrated embodiment, the luminous layers R, G and B of red, green and blue luminous colors are used. Alternatively, a luminous layer emitting light of a yellow luminous color may be used for display as required.

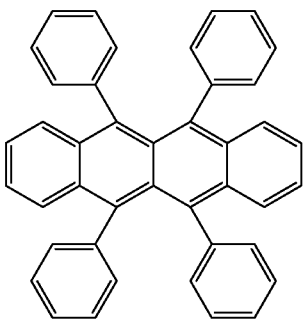

The chemical formula (4) indicates $Alq_3$+Rubrene doped (3 mol %), rubrene. It emits light of a yellow luminous color and has a band gap Eg of 2.2 eV.

The inventors found that when the luminous layers R, G and B respectively including phosphors of red, green and blue luminous colors are made in the form of a strip-like film by one color for every one time in order while shifting the common mask, a degree of leakage luminescence in the organic EL device obtained is substantially affected by the order of formation of the luminous layers. As a result, the organic EL device of the illustrated embodiment was realized by way of example.

Figure 2:
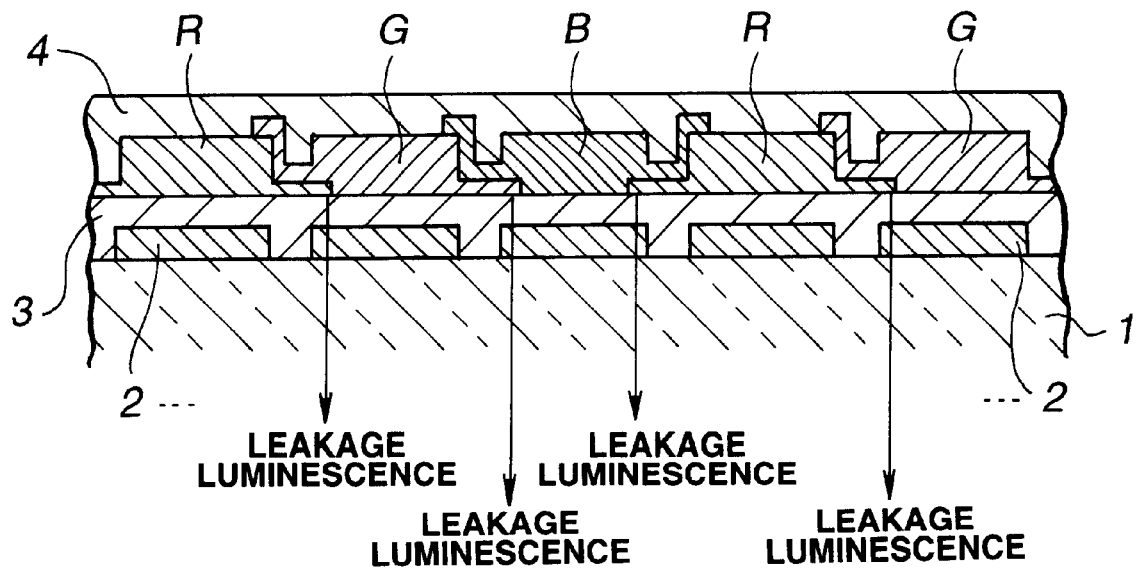
FIG. 2 is a fragmentary sectional view showing an organic EL device of a comparative example and a problem encountered with the comparative example.
Figure 3:
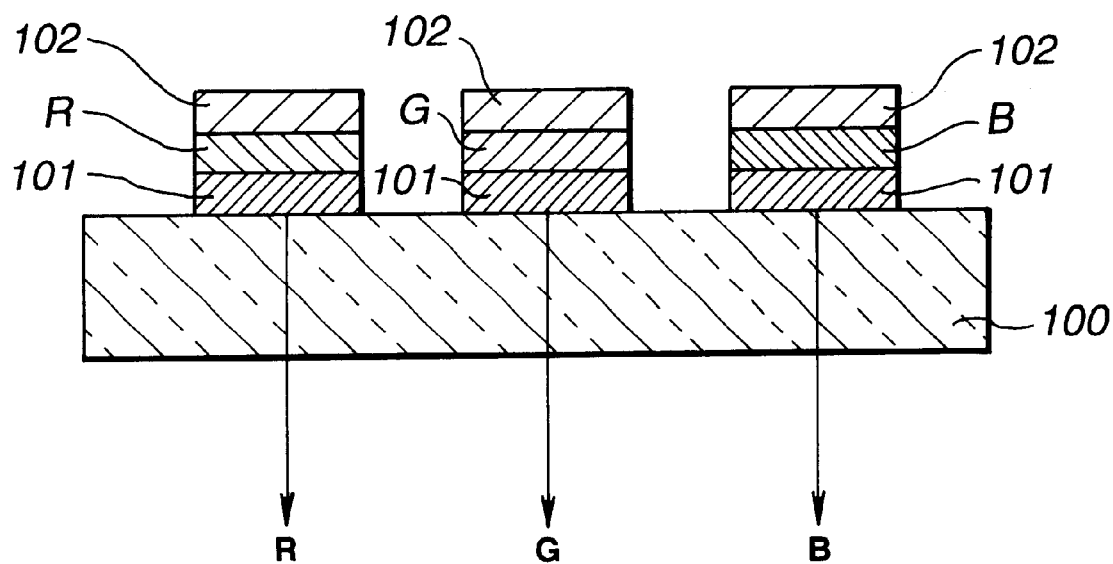
FIG. 3 is a sectional view showing a conventional organic EL device by way of example.

On the contrary, when formation of the luminous layers is carried out in order of the band gap Eg from a large magnitude thereof to a small magnitude thereof unlike the present invention, increased leakage luminescence occurs in the luminous layer B of a blue luminous color as shown in FIG. 2.

In this instance, contrary to the illustrated embodiment, the adjacent luminous layers which causes leakage luminescence at an interface with the hole transport layer 3 each have a band gap Eg smaller than that of the luminous layer which is to emit light. This causes recombination energy to be moved to the adjacent luminous layer of a small band gap Eg in which leakage luminescence occurs, leading to color mixing, resulting in keeping intervals of arrangement of the anodes 2 from being reduced. In this respect, an experiment revealed that even intervals of the arrangement as large as 0.5 mm fails to eliminate the leakage luminescence, leading to a failure in providing fine display. The present invention eliminates such a disadvantage, to thereby ensure full-color display at high definition.

The above description has been made in connection with the luminous layers B, G and R of blue, green and red luminous colors. The present invention may be also applied to arrangement of luminous layers of different luminous colors. Further, the illustrated embodiment is constructed so as to carry out multi-color graphic display by means of a plurality of strip-like anodes 2 and a plurality of strip-like cathodes 4 arranged perpendicular to the anodes. The present invention may be effectively applied to fixed pattern display wherein an interval between adjacent segments is reduced as well.

As can be seen from the foregoing, the organic EL device of the present invention is so constructed that the anodes, hole transport layer, luminous layers different in type from each other and cathodes are laminated. In such a laminate structure, the luminous layers different in type which are arranged adjacently to each other are constructed so as to permit the luminous layer increased in band gap to get between the luminous layer decreased in band gap and the hole transport layer. Such construction of the present invention exhibits the following significant advantages.

In general, when luminous layers for a multi-color organic EL device are made by mask deposition techniques, contact of a mask with a hole transport layer causes damage to the hole transport layer or cross-contamination, so that a deposited material gets under the hole transport layer. On the contrary, the present invention, even when the adjacent luminous layer gets under an edge of the luminous layer concerned, effectively prevents leakage luminescence of the adjacent luminous layer. This permits the luminous layers different in type from each other to be separately arranged at fine intervals by mask deposition techniques. Thus, application of the present invention to graphical display permits full-color display at high definition to be provided.

Also, the present invention provides full-color display using phosphors different in luminous color from each other. This permits light to be utilized with high efficiency as compared with a system in which red, green and blue filters are applied to a phosphor of a white luminous color, leading to a reduction in power consumption and manufacturing cost.

Further, the present invention may be effectively applied to arrangement of luminous layers of luminous colors other than blue, green and red.

Moreover, the present invention may be applied to graphic display, as well as fixed pattern display wherein segments adjacent to each other are arranged at reduced intervals.

While a preferred embodiment of the invention has been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A multi-color organic electroluminescence device comprising:
    a substrate;
    anodes formed on said substrate;
    a hole transport layer formed on said anodes;
    a plurality of luminous layers different in kind and band gap from each other formed on said hole transport layer; and
    cathodes formed on said luminous layers,
    wherein said luminous layers are arranged horizontally in a side-by-side relationship on the hole transport layer so as to be adjacent to each and to overlap at edges thereof in such a manner that an edge of a luminous layer having a smaller band gap rests on an edge of a luminous layer having a larger band gap.

2. A multi-color organic electroluminescence device as defined in claim 1, wherein said luminous layers different in kind and band gap from each other include at least two selected from the group consisting of a luminous layer of a blue luminous color, a green luminous color, and a red luminous color.

3. A multi-color organic electroluminescence device comprising:
    a substrate;
    a plurality of strip-like anodes formed on said substrate in a manner to be spaced from each other at predetermined intervals;

a hole transport layer formed on said substrate so as to cover said anodes;

a plurality of luminous layers different in kind and band gap from each other which are formed in a predetermined order on said hole transport layer and arranged in a strip-like manner corresponding to said anodes; and a plurality of strip-like cathodes formed at predetermined intervals on said luminous layers so as to intersect said anodes, wherein said luminous layers are arranged horizontally in a side-by-side relationship on the hole transport layer so as to be adjacent to each and to overlap at edges thereof in such a manner that an edge of luminous layer having a smaller band gap rests on an edge of a luminous layer having a larger band gap.

4. A multi-color organic electroluminescence device as defined in claim 3, wherein said luminous layers different in kind and band gap from each other include at least two selected from the group consisting of a luminous layer of a blue luminous color, a green luminous color, and a red luminous color.

* * * * *

UNITED STATES PATENT AND TRADEMARK OFFICE
CERTIFICATE OF CORRECTION

PATENT NO. : 6,288,486 B1
DATED : September 11, 2001
INVENTOR(S) : Tsuruoka et al.

It is certified that error appears in the above-identified patent and that said Letters Patent is hereby corrected as shown below:

<u>Title page,</u>
Item [73], Assignee, should read:

-- [73] Assignee: Futaba Denshi Kogyo Kabushiki Kaisha, Mobara-shi, (JP) --

Signed and Sealed this

Seventh Day of May, 2002

Attest:

Attesting Officer

JAMES E. ROGAN
*Director of the United States Patent and Trademark Office*